(12) United States Patent
Barbetta

(10) Patent No.: US 6,723,913 B1
(45) Date of Patent: Apr. 20, 2004

(54) FAN COOLING OF ACTIVE SPEAKERS

(76) Inventor: Anthony T. Barbetta, 5345 N. Commerce Ave., #5, Moorpark, CA (US) 93021

( * ) Notice: Subject to any disclaimer, the term of this patent is extended or adjusted under 35 U.S.C. 154(b) by 0 days.

(21) Appl. No.: 10/198,300

(22) Filed: Jul. 16, 2002

Related U.S. Application Data
(60) Provisional application No. 60/314,696, filed on Aug. 23, 2001.

(51) Int. Cl.[7] .................................................. H05K 5/00
(52) U.S. Cl. .................... 174/17 VA; 174/50; 361/600; 361/704; 181/157
(58) Field of Search ............................. 174/17 VA, 50; 361/600, 679, 694, 695, 704, 707, 715, 724, 727, 687; 181/157, 148, 150, 153, 185

(56) References Cited

U.S. PATENT DOCUMENTS

| 5,533,132 A | * | 7/1996 | Button .................... 381/332 |
| 5,771,154 A | * | 6/1998 | Goodman et al. .......... 361/704 |
| 5,973,261 A | * | 10/1999 | Chevallet et al. ....... 174/17 VA |
| 6,103,972 A | * | 8/2000 | Hagarty ................... 174/53 |
| 6,362,951 B1 | * | 3/2002 | Moribe et al. ............. 361/600 |
| 6,520,282 B1 | * | 2/2003 | Hadzic et al. ............. 181/199 |

* cited by examiner

Primary Examiner—Dhiru R Patel
(74) Attorney, Agent, or Firm—Sierra Patent Group, Ltd.

(57) ABSTRACT

The disclosed device is directed towards an active audio speaker system having at least one audio speaker and an amplifier electrically coupled thereto. The active audio speaker system includes a cabinet having an enclosure defining an interior of the cabinet and an exterior of the cabinet. The interior contains the amplifier. A cooling unit is contiguous with the enclosure of the cabinet. The cooling unit includes a conduction module thermally coupled to the amplifier and a forced convection module at the exterior. The forced convection module is configured to transfer thermal energy from the conduction module.

10 Claims, 3 Drawing Sheets

FAN COOLING OF ACTIVE SPEAKERS

PRIORITY

This application claims benefit of U.S. Provisional Application Serial No. 60/314,696, filed Aug. 23, 2001.

BACKGROUND

The present disclosure relates to the field of thermal management of electronics within audio sound devices. In particular, the present disclosure relates to an apparatus with conductive heat transfer and forced convective cooling of components in an audio speaker cabinet.

Audio speaker systems are often enhanced by the use of electronic amplifier circuits having transistors installed inside the cabinet of audio speakers. Such speaker systems are called "active loud speaker systems." Transistors are limited in the amount of power they can reliably transfer by the operating temperature of the silicon die of the transistor. The semiconductor junction may reach safe normal operating temperatures of about 150 degrees centigrade.

Transistors are mounted on a heat-dissipating device, or heat sink, to transfer thermal energy away from the transistors. A heat sink thermally coupled to a transistor at an operating temperature of about 150 degrees centigrade, can rise to temperatures of about 100 degrees to about 125 degrees centigrade. The effect of thermal resistance of the mounting interfaces between the heat sink and the transistor contribute to the temperatures attained.

Cooling fins are employed with the heat sink in order to increase the surface area of the heat sink, thereby improving the cooling capacity of the heat sink. The cooling fins are placed on the exterior of the audio speaker cabinet to remove the thermal energy to the exterior of the audio speaker cabinet. The cooling fins also serve the purpose of creating a safe distance between the hottest surfaces of the heat sink and the skin of people that handle the equipment.

However, cooling fins also create problems that can inhibit transport of the equipment. Since cooling fins are arranged at the exterior of the equipment, they often present a bulky obstacle on the outer surface of the cabinet. The cooling fins are typically sharp and can cut hands and arms. Cooling fins add to the weight of the equipment, thus inhibiting transportation of the equipment. Fin assemblies are also costly and made of materials that are often brittle and susceptible to fracture and cracking, which can create more sharp edges.

Adding to the problems in the art is the growing demand for improved audio speaker equipment, such as the active loudspeaker system. The active loudspeaker systems have become popular in part for the many uses and convenience they offer. The fundamental design of the active loudspeaker places a power amplifier in the speaker cabinet. Locating the power amplifier inside the cabinet imposes functional operational limitations on the built-in power amplifiers.

Power amplifiers mounted within an enclosed space, such as a speaker cabinet, can present a designer with considerable cooling problems. The thermal energy generated in the power amplifier creates an increase in the air temperature inside the cabinet. As a result, mechanical means that will remove the thermal energy from the electronics within the speaker cabinet is needed. This device should avoid the drawbacks of cooling fins, but still offset the additional heat added to the interior of the cabinet.

SUMMARY

The disclosed device is directed towards an active audio speaker system having at least one audio speaker and an amplifier electrically coupled thereto. The active audio speaker system comprises a cabinet having an enclosure defining an interior of the cabinet and an exterior of the cabinet. The interior contains the amplifier. A cooling unit is contiguous with the enclosure of the cabinet. The cooling unit includes a conduction module thermally coupled to the amplifier and a forced convection module at the exterior. The forced convection module is configured to transfer thermal energy from the conduction module.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons having the benefit of this disclosure.

Figure 1:
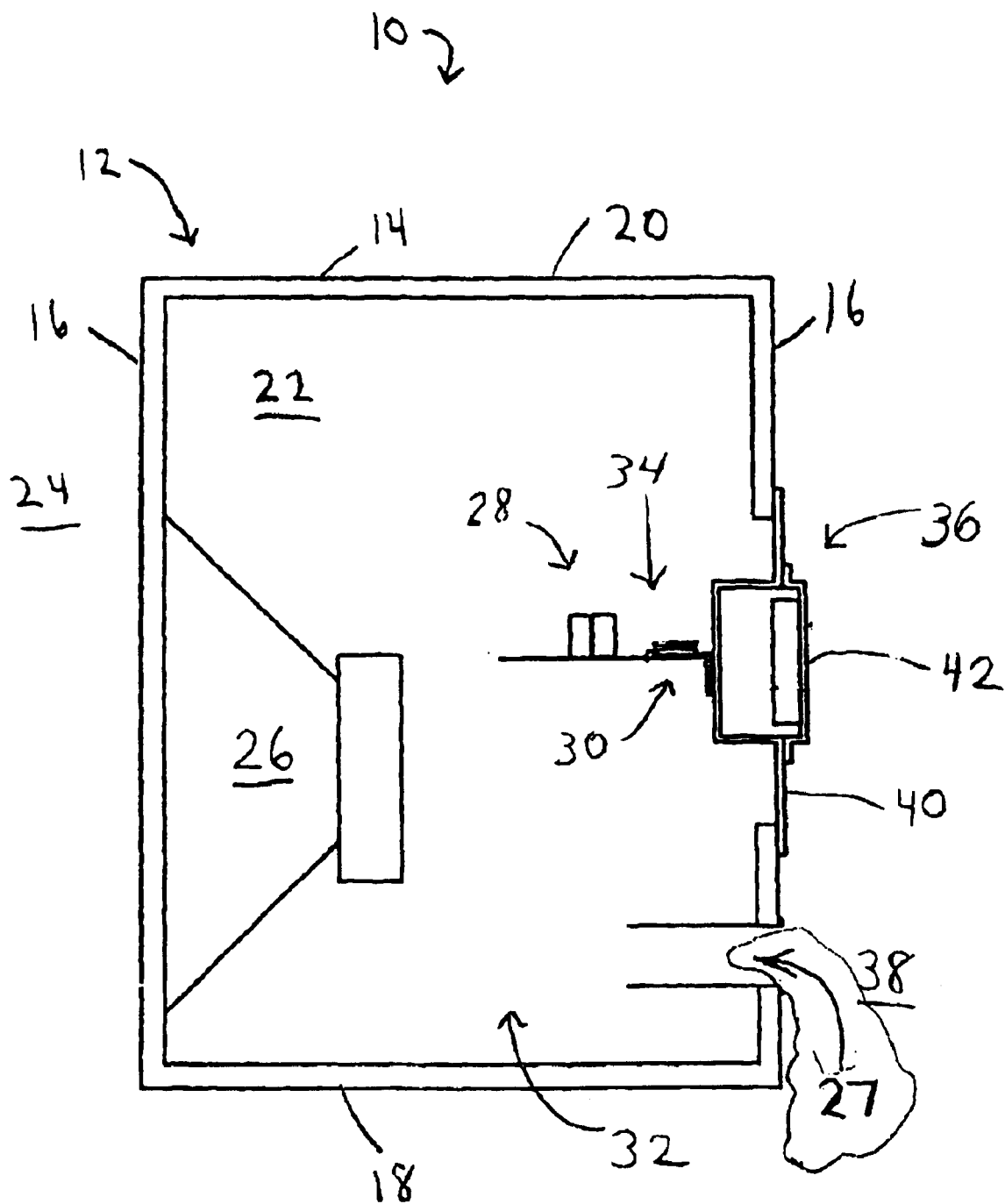
FIG. 1 is a side cross sectional view of an exemplary embodiment of a fan cooled audio speaker system.

FIG. 1 illustrates a side cross sectional view of an exemplary embodiment of a fan cooled active audio speaker system 10. The fan cooled active audio speaker 10 includes a cabinet 12 having a top 14 supported by sides 16 attached to a bottom 18. The top 14, sides 16, and bottom 18 form an enclosure 20 that defines an interior 22 and an exterior 24. The top 14, sides 16 and bottom 18 can be made of wood, wood composite, plastics, plastic composites, and the like. The materials used for the construction of the top 14, sides 16 and bottom 18 are chosen for the material properties of strength and durability, as well as acoustic properties. A loudspeaker, or speaker 26 is mounted to one of the sides 16 and is exposed to both the interior 22 and the exterior 24. It is contemplated that multiple speakers 26 of various types can be equipped with the cabinet 12. At least one opening or port 27 is defined in the enclosure 20. The port 27 is used for acoustic tuning of the speaker 26. The enclosure 20 serves as a bass reflex for the speaker 26.

An amplifier 28 is mounted in the interior 22 and in an exemplary embodiment, is mounted proximate to one of the sides 16 in the interior 22 of the enclosure 20. The amplifier 28 of an active speaker system includes power transistors, and the like. The amplifier 28 requires electrical current to operate and provides a resistance to the electrical current. Thus, the amplifier 28 converts electrical energy into thermal energy or heat. The amplifier 28 has hot surfaces as a result of generating the thermal energy. The amplifier 28 also transfers thermal energy to a mounting device 30 and interior air 32 filling the interior 22 of the enclosure 20. The amplifier 28 and mounting device 30 are collectively called components 34.

The mounting device 30 mounts to a cooling unit 36 to maintain the amplifier 28 in a stable and operative condition. The amplifier 28 can also be directly mounted to the cooling unit 36. The cooling unit 36 is mounted contiguous with the enclosure 20. The cooling unit 36 separates the interior air 32 from exterior air 38. In a preferred embodiment, the cooling unit 36 can be mounted to a side 16. It is contemplated that the cooling unit 36 can be mounted to the enclosure at any location, such as the top 14. It is also contemplated that the cooling unit 36 be integral with the enclosure 20. The cooling unit 36 includes a conduction module 40 thermally coupled to the components 34. Thermally coupling means to be configured to allow for heat transfer. The cooling unit 36 also includes a forced convection module 42 configured to cool the conduction module 40 by forced convection of the exterior air 38 over the surface of the conduction module 40.

Figure 2:
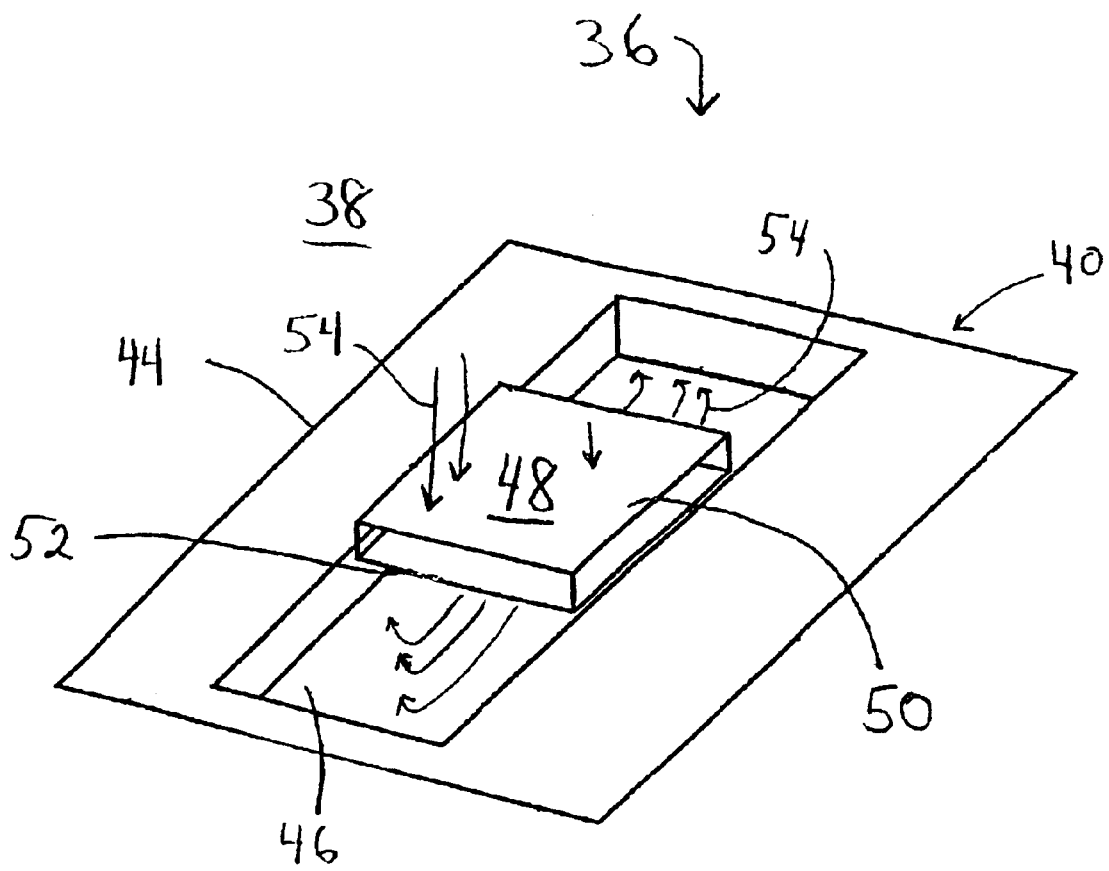
FIG. 2 is a perspective view of an exemplary embodiment of a cooling unit.

Referring now to FIG. 2, an exemplary embodiment of the cooling unit 36 is illustrated in a perspective view. The conduction module 40 includes at least one conduction chassis 44 having thermal conductive properties. The conduction chassis 44 can be made of aluminum, copper, diamond, and the like, as well as any combination of thermally conductive materials, composites, and configurations that also provide structural support. The conduction chassis 44 can have surface effects, such as ridges, that promote convection. The conduction chassis 44 can also include heat sinks integral with the structure, and other conduction enhancing features. The conduction chassis 44 defines a chamber 46. The chamber 46 provides a space for the forced convection module 42 (partially shown) to be mounted and to circulate exterior air 38 across a portion of the conduction chassis 44. FIG. 2 illustrates only a part of the forced convection module 42. FIG. 2 illustrates a fan unit 48 that is part of the forced convection module 42. The fan unit 48 circulates the exterior air 38 into a fan inlet 50 and out of a fan outlet 52 towards the relatively hot surface of the conduction chassis 44 inside the chamber 46 of the conduction module 40, as represented by flow arrows 54. The hot surfaces of the conduction chassis 44 transfer the thermal energy from the components 34 mounted to the conduction module 40 (See FIGS. 1 and 3).

Figure 3:
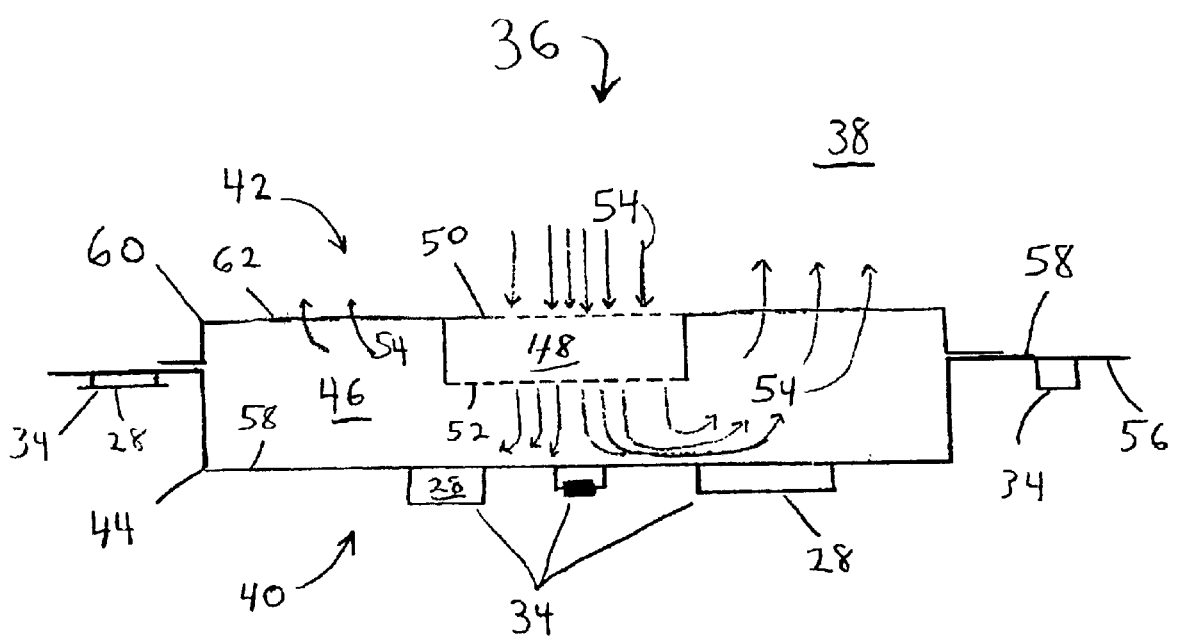
FIG. 3 is a sectional view of an exemplary embodiment of a cooling unit.

Referring now to FIG. 3, a sectional side view of the cooling unit 36 is illustrated. The cooling unit 36 is shown with an exemplary conduction module 40 and an exemplary forced convection module 42 coupled together. The conduction module 40 has the conduction chassis 44 supporting the components 34 on an interior surface 56 and supporting the forced convection module. 42 on an exterior surface 58. When the cooling unit 36 is installed with a cabinet 12, the interior surface 56 is exposed to the interior 22 of the cabinet 12 and the exterior surface 56 is exposed to the exterior 24 of the cabinet 12. The forced convection module 42 is mounted to the exterior surface 58 by a frame 60. The frame 60 supports the fan unit 48. The frame includes at least one grill 62 arranged in a pattern that allows air to flow through while preventing finger sized objects from penetrating past the grill 62. In a preferred embodiment, the grill 62 is located on opposite sides of the fan unit 48, such that exterior air 38 when exhausted from the fan unit. 48 can circulate over a larger surface area of the conduction chassis 44. The grill 62 is also located in order to exhaust the warmed air away from the fan inlet 50 to prevent the warmed exterior air 38 from being recirculated into the chamber 46. The fan unit 48 is mounted such that the fan outlet 52 is proximate to the exterior surface 56 of the conduction chassis 44 inside the chamber 46. The fan inlet 50 is located distal from the exterior surface 56 of the conduction chassis 44 inside the chamber 46.

In referring to FIGS. 1, 2, and 3, the operation of the cooling unit 36 within the fan cooled audio speaker system 10 can be described. The cooling unit 36 cools the hot components 34. As the amplifier 28 operates, thermal energy is produced. The thermal energy is transferred from hot regions to cooler regions. Some thermal energy is transferred by natural convection from the hot components 34 to the interior air 32. A significant quantity of the thermal energy generated by the amplifier 28 is conducted through the mounting device 30. Alternatively, if the amplifier 28 is mounted directly to the conduction chassis 44, then the thermal energy can be conducted directly to the conduction chassis 44.

The thermal energy is conducted away from the hot components 34 to the cooler regions of the conductive chassis 44. A portion of the thermal energy being conducted by the conduction chassis 44 is transferred to the interior air 22 and to the exterior air 38 by natural convection. The largest portion of the thermal energy is transferred to the external air 38 through the forced convection of the external air 38. The external air 38 is pulled into the fan inlet 50 of the fan unit 48. The exterior air 38 is exhausted from the fan outlet 52 in the chamber 46 toward the exterior surface 58 of the conduction chassis 44. The air is warmed as it passes over the exterior surface 58 and discharges out of the chamber 46 through the grill 62. The heated air passes through the grill 62 and mixes with the exterior air 38 on the outside of the cooling unit 36. Airflow arrows 54 illustrate the flow of cooling air through the cooling unit 36.

While embodiments and applications of this invention have been shown and described, it would be apparent to those skilled in the art that many more modification than mentioned above are possible without departing from the inventive concepts herein. The invention, therefore, is not to be restricted except in the spirit of the appended claims.

What is claimed is:

1. An active audio speaker system having at least one audio speaker and an amplifier electrically coupled thereto, the active audio speaker system comprising:

a cabinet having an enclosure defining an interior of said cabinet and an exterior of said cabinet, said interior containing the amplifier;

a cooling unit contiguous with said enclosure of said cabinet, said cooling unit including a conduction module thermally coupled to said amplifier and a forced convection module at said exterior, said forced convection module configured to transfer thermal energy from said conduction module.

2. The active audio speaker system of claim 1 wherein the amplifier is mounted to said conduction module within said interior of said cabinet.

3. The active audio speaker system of claim 1 wherein said cabinet includes at least one opening to allow air to flow into and out of said interior, and said conduction module prevents air from flowing into and out of said interior.

4. The active audio speaker system of claim 3 wherein said at least one opening is a port for acoustic tuning.

5. The active audio speaker system of claim 1 wherein the amplifier mounted to said conduction module within said interior of said cabinet is at least cooled by thermal conduction created by said thermal coupling with said conduction module and said conduction module being cooled by at least said forced convection module.

6. The active audio speaker system of claim 1 wherein said forced convection module is at least one axial fan unit.

7. The active audio speaker system of claim 1 wherein said forced convection module is configured to direct exterior cooling air over said conduction module at said exterior of said cabinet.

8. The active audio speaker system of claim 1 wherein said forced convection module circulates exterior air exclusively.

9. The active audio speaker system of claim 1 wherein said forced convection module includes an air inlet and an air outlet at said exterior.

10. The active audio speaker system of claim 1 wherein said conduction unit includes surface features that enhance heat transfer to said exterior.

* * * * *